(12) United States Patent
Hu et al.

(10) Patent No.: US 11,011,437 B2
(45) Date of Patent: May 18, 2021

(54) METHOD AND APPARATUS FOR DETERMINING WIDTH-TO-LENGTH RATIO OF CHANNEL REGION OF THIN FILM TRANSISTOR

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yingbin Hu, Beijing (CN); Ce Zhao, Beijing (CN); Yuankui Ding, Beijing (CN); Wei Song, Beijing (CN); Jun Wang, Beijing (CN); Yang Zhang, Beijing (CN); Wei Li, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/452,952

(22) Filed: Jun. 26, 2019

(65) Prior Publication Data
US 2020/0161196 A1 May 21, 2020

(30) Foreign Application Priority Data
Nov. 20, 2018 (CN) .......................... 201811385425.3

(51) Int. Cl.
*H01L 21/66* (2006.01)
*G03F 7/20* (2006.01)
(Continued)

(52) U.S. Cl.
CPC ............ *H01L 22/20* (2013.01); *G03F 7/2043* (2013.01); *H01L 21/44* (2013.01); *H01L 21/467* (2013.01);
(Continued)

(58) Field of Classification Search
CPC ... H01L 21/567; H01L 22/20; H01L 29/1033; H04L 25/0202
See application file for complete search history.

(56) References Cited

U.S. PATENT DOCUMENTS 6,703,953 B2 * 3/2004 Maeda .................... H01L 23/57
   341/144
7,091,077 B1 * 8/2006 Liu ................... H01L 21/28035
   257/E21.197
(Continued)

OTHER PUBLICATIONS

Hook et al., "The dependence of Channel Length on Channel Width in Narrow-Channel CMOS Devices for 0.35-0.13 um Technologies", IEEE Electron Device Letters, vol. 21, No. 2, Feb. 2000. pp. 85-87 (Year: 2000).*
(Continued)

*Primary Examiner* — William Coleman
(74) *Attorney, Agent, or Firm* — Nath, Goldberg & Meyer; Joshua B. Goldberg

(57) ABSTRACT

The present disclosure provides a method for determining a width-to-length ratio of a channel region of a thin film transistor (TFT). The method includes: S1, setting an initial width-to-length ratio of the channel region; S2, manufacturing a TFT by using a mask plate according to the initial width-to-length ratio; S3, testing the TFT manufactured according to the initial width-to-length ratio; S4, determining whether or not the test result satisfies a predetermined condition, performing S5 if the test result satisfies the predetermined condition, and performing S6 if the test result does not satisfy the predetermined condition; S5, determin-
(Continued)

ing the initial width-to-length ratio as the width-to-length ratio of the channel region of the TFT; S6, changing the value of the initial width-to-length ratio, adjusting a position of the mask plate according to the changed initial width-to-length ratio, and performing S2 to S4 again.

8 Claims, 3 Drawing Sheets

(51) Int. Cl.
  *H01L 21/44* (2006.01)
  *H01L 21/467* (2006.01)
  *H01L 29/66* (2006.01)
  *H01L 29/786* (2006.01)
(52) U.S. Cl.
  CPC .... *H01L 29/66969* (2013.01); *H01L 29/7869* (2013.01); *H01L 29/78633* (2013.01); *H01L 29/78693* (2013.01)

(56) References Cited

U.S. PATENT DOCUMENTS

| | | | | |
|---|---|---|---|---|
| 7,339,187 | B2* | 3/2008 | Wager, III | H01L 29/02 257/43 |
| 8,304,298 | B2* | 11/2012 | Ofuji | H01L 27/1233 438/149 |
| 8,410,816 | B1* | 4/2013 | Liu | H03K 19/018521 326/68 |
| 9,666,722 | B2* | 5/2017 | Matsubayashi | H01L 29/78696 |
| 9,705,004 | B2* | 7/2017 | Kobayashi | H01L 27/0688 |
| 9,791,497 | B2* | 10/2017 | Lu | G01R 31/2621 |
| 2001/0038098 | A1* | 11/2001 | Yamazaki | H01L 27/3211 257/72 |
| 2003/0200071 | A1* | 10/2003 | Zhang | G06F 30/367 703/15 |
| 2003/0224550 | A1* | 12/2003 | Kokubo | H01L 27/1285 438/48 |
| 2013/0200376 | A1* | 8/2013 | Yamazaki | H01L 29/78693 257/57 |
| 2015/0276850 | A1* | 10/2015 | Lu | G06F 30/36 702/65 |
| 2017/0278874 | A1* | 9/2017 | Yamazaki | H01L 29/7869 |

OTHER PUBLICATIONS

Rezzak et al., "The impact of device width on the variability of post-irradiation leakage currents in 90 and 65 nm CMOS technologies", Microelectgronic Reliability, vol. 52, Jun. 16, 2012, pp. 2521-2526 (Year: 2012).*

* cited by examiner

METHOD AND APPARATUS FOR DETERMINING WIDTH-TO-LENGTH RATIO OF CHANNEL REGION OF THIN FILM TRANSISTOR

CROSS-REFERENCE TO RELATED APPLICATION

This application claims the benefit of priority to Chinese Patent Application No. 201811385425.3 filed on Nov. 20, 2018, the contents of which are incorporated herein by reference in the entirety.

TECHNICAL FIELD

The present disclosure relates to the field of thin film transistor (TFT) technology, and in particular, to a method for determining a width-to-length ratio of a channel region of a TFT and an apparatus for determining a width-to-length ratio of a channel region of a TFT.

BACKGROUND

TFTs are important components in microelectronic apparatuses, and performance of the TFTs has an important impact on performance of the microelectronic apparatuses. For a TFT, indexes for measuring its performance include its on-state current, carrier mobility, threshold voltage, etc., and a width-to-length ratio of a channel region of the TFT has a crucial influence on the above indexes.

Therefore, in order to obtain a TFT with good performance, the width-to-length ratio of the channel region of the TFT should be determined before mass production for the TFT.

SUMMARY

One aspect of the present disclosure provides a method for determining a width-to-length ratio of a channel region of a thin film transistor (TFT). The method includes: a step S1, setting an initial width-to-length ratio of the channel region; a step S2, manufacturing a TFT by using a mask plate according to the initial width-to-length ratio; a step S3, testing the TFT manufactured according to the initial width-to-length ratio; a step S4, determining whether or not a result of the testing satisfies a predetermined condition, performing a step S5 if the result of the testing satisfies the predetermined condition, and performing a step S6 if the result of the testing does not satisfy the predetermined condition; the step S5, determining the initial width-to-length ratio as the width-to-length ratio of the channel region of the TFT; and the step S6, changing the initial width-to-length ratio, adjusting a position of the mask plate according to the changed initial width-to-length ratio, and performing the steps S2 to S4 again.

According to an embodiment of the present disclosure, the step S2 includes: forming an active layer and a gate electrode. The channel region is defined by a region of the active layer covered by an orthographic projection of the gate electrode on the active layer and has a width-to-length ratio equal to the initial width-to-length ratio.

According to an embodiment of the present disclosure, the mask plate includes a first mask plate, and the step of forming the active layer and the gate electrode includes: forming the active layer, and forming the gate electrode on the active layer. The step of forming the gate electrode includes: forming a gate electrode material layer on the active layer; forming a photoresist layer on the gate electrode material layer; exposing the photoresist layer by using an exposure area of the first mask plate; developing the exposed photoresist layer to form a protective pattern having the same shape as that of the gate electrode; and etching the gate material layer by using the protective pattern as a mask to form the gate electrode.

According to an embodiment of the present disclosure, the step S6 includes: changing a position of an orthographic projection area of the exposure area of the first mask plate on the photoresist layer to change a position of an orthographic projection area of the gate electrode of the TFT to be formed by performing the steps S2 to S4 again on the active layer of the TFT to be formed by performing the steps S2 to S4 again, such that the TFT to be formed by performing the steps S2 to S4 again has a width-to-length ratio equal to the changed initial width-to-length ratio.

According to an embodiment of the present disclosure, the step of changing the position of the orthographic projection area of the exposure area of the first mask plate on the photoresist layer includes: changing the position of the orthographic projection area of the exposure area of the first mask plate on the photoresist layer in a width direction of the active layer, the width direction of the active layer being a direction perpendicular to an extending direction of a source electrode and a drain electrode of the TFT to be formed.

According to an embodiment of the present disclosure, the mask plate includes a second mask plate, and the step of forming the active layer and the gate electrode includes: forming the gate electrode, and forming the active layer on the gate electrode. The step of forming the active layer includes: forming an active material layer on the gate electrode; forming an photoresist layer on the active material layer; exposing the photoresist layer by using an exposure area of the second mask plate; developing the exposed photoresist layer to form a protective pattern having the same shape as that of the active layer; and etching the active material layer by using the protective pattern as a mask to form the active layer.

According to an embodiment of the present disclosure, the step S6 includes: changing a position of an orthographic projection area of the exposure area of the second mask plate on the photoresist layer to change a position of an orthographic projection area of the gate electrode of the TFT to be formed by performing the steps S2 to S4 again on the active layer of the TFT to be formed by performing the steps S2 to S4 again, such that the TFT to be formed by performing the steps S2 to S4 again has a width-to-length ratio equal to the changed initial width-to-length ratio.

According to an embodiment of the present disclosure, the step of changing the position of the orthographic projection area of the exposure area of the second mask plate on the photoresist layer includes: changing the position of the orthographic projection area of the exposure area of the second mask plate on the photoresist layer in a width direction of the active layer, the width direction of the active layer being a direction perpendicular to an extending direction of a source electrode and a drain electrode of the TFT to be formed.

According to an embodiment of the present disclosure, the step S2 includes: forming a light shielding layer, a buffer layer, the active layer, a gate insulating layer, the gate electrode and an interlayer insulating layer on a substrate sequentially. An orthographic projection of the light shielding layer on the substrate completely covers an orthographic projection of the active layer on the substrate, the buffer layer insulates and separates the light shielding layer from the active layer, the gate insulating layer insulates and separates the gate electrode from the active layer and covers only a portion of the active layer, and a portion of the gate electrode is on the gate insulating layer and another portion of the gate electrode is on the buffer layer.

According to an embodiment of the present disclosure, the step S2 further includes: forming a source via hole, a drain via hole and a gate via hole that penetrate through the interlayer insulating layer, the source via hole and the drain via hole being respectively formed on a portion of the active layer which is not covered by the gate insulating layer, the gate via hole being formed on the portion of the gate electrode on the buffer layer; and forming a source electrode, a drain electrode and a gate connection member in the source via hole, the drain via hole and the gate via hole, respectively, the source electrode and the drain electrode being coupled to the active layer, respectively, and the gate connection member being coupled to the gate electrode.

According to an embodiment of the present disclosure, the active layer is made of a material including at least one of IGZO, amorphous ZnO, polycrystalline ZnO, InZnO and ZnSnO.

According to an embodiment of the present disclosure, the predetermined condition includes at least one of a condition in which an on-state current of the TFT is within a predetermined current range, a condition in which a threshold voltage of the TFT is within a predetermined voltage range, and a condition in which a carrier mobility of the channel region of the TFT is within a predetermined mobility range.

Another aspect of the present disclosure provides an apparatus for determining a width-to-length ratio of a channel region of a thin film transistor (TFT). The apparatus includes: a width-to-length ratio setting device configured to set an initial width-to-length ratio of the channel region; a manufacturing device configured to manufacture a TFT by using a mask plate according to the initial width-to-length ratio; a testing device configured to test the TFT manufactured according to the initial width-to-length ratio; and a determining device configured to determined whether or not a result tested by the testing device satisfies a predetermined condition. In response to the result being determined to satisfy the predetermined condition, the width-to-length ratio setting device determines the initial width-to-length ratio as the width-to-length ratio of the channel region of the TFT, and in response to the result being determined to not satisfy the predetermined condition, the width-to-length ratio setting device changes the initial width-to-length ratio and adjusts a position of the mask plate according to the changed initial width-to-length ratio.

BRIEF DESCRIPTION OF THE DRAWINGS

The accompanying drawings, which constitute a part of the specification, are provided for further understanding of the disclosure, and for explaining the present disclosure together with the following specific embodiments, but not intended to limit the present disclosure. In the drawings.

DETAILED DESCRIPTION

Embodiments of the present disclosure will be described in detail below in conjunction with accompanying drawings. It is to be understood that the embodiments to be described herein are merely for illustration and explanation of the disclosure and are not intended to limit the present disclosure.

Figure 1:
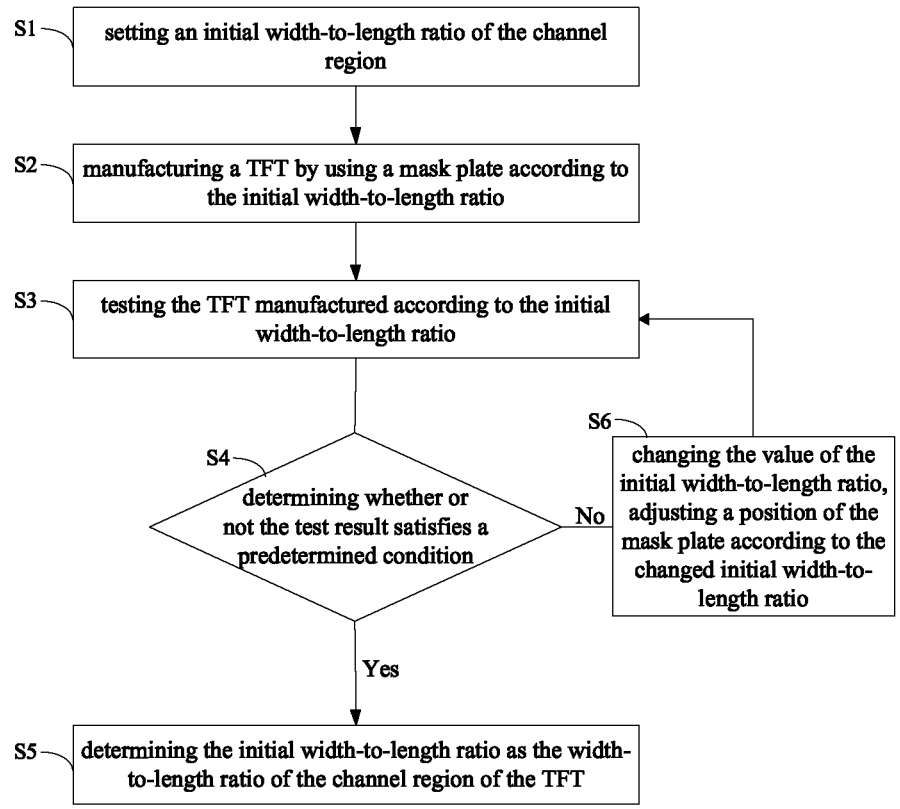
FIG. 1 is a flow chart of a method for determining a width-to-length ratio of a channel region of a thin film transistor (TFT) according to an embodiment of the present disclosure.

FIG. 1 is a flow chart of a method for determining a width-to-length ratio of a channel region of a thin film transistor (TFT) according to an embodiment of the present disclosure.

Figure 2:
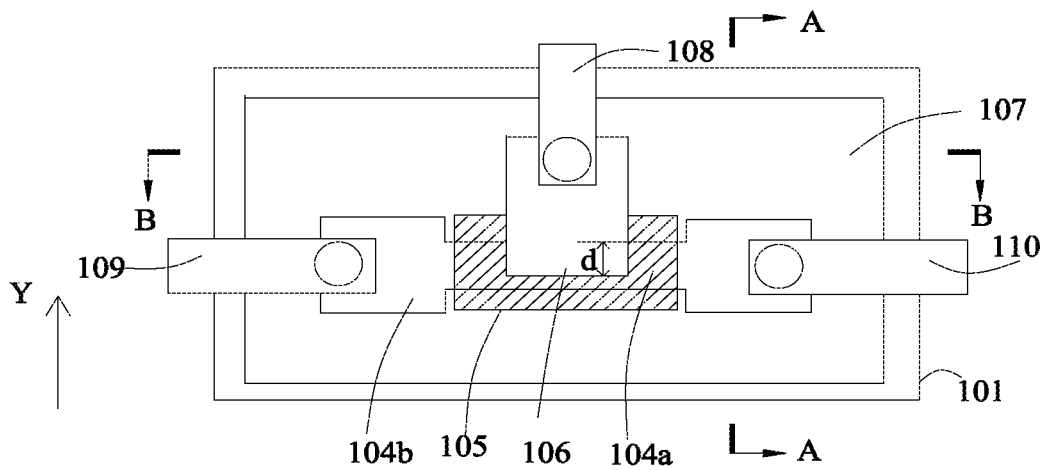
FIG. 2 is a schematic top view of the TFT manufactured in step S2 of FIG. 1.
Figure 3:
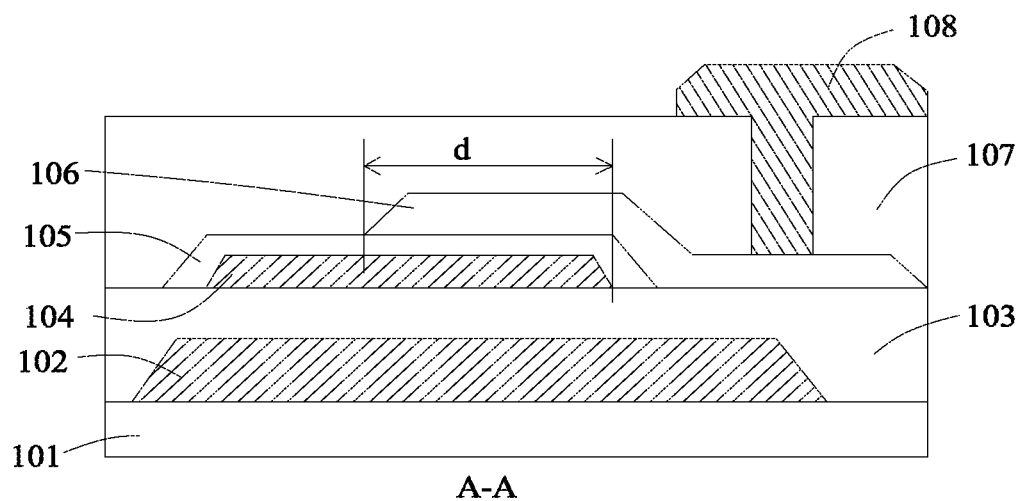
FIG. 3 is a cross-sectional view of the TFT of FIG. 2 taken along line A-A.
Figure 4:
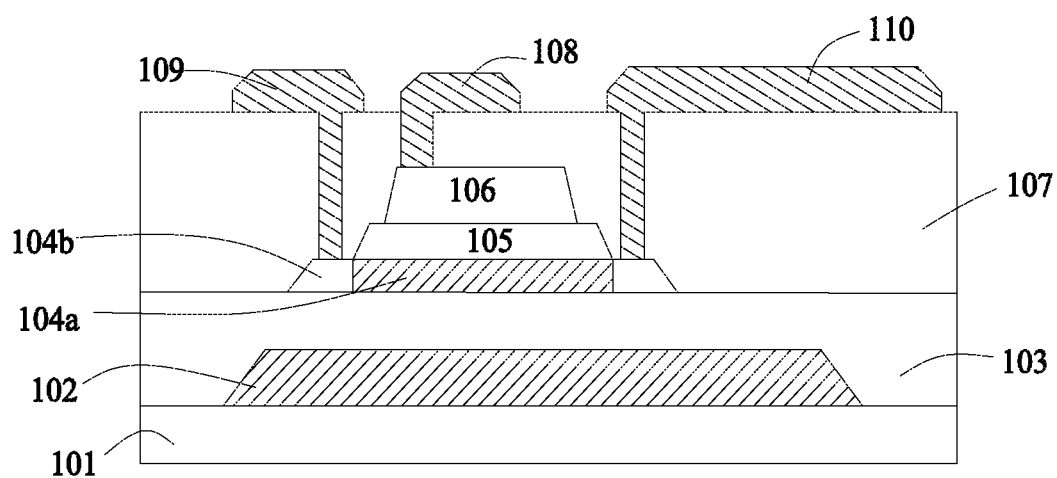
FIG. 4 is a cross-sectional view of the TFT of FIG. 2 taken along line B-B.

As shown in FIG. 1, in step S1, an initial width-to-length ratio of the channel region of the TFT is set. In step S2, the TFT is fabricated by using a mask plate according to the initial width-to-length ratio, and for example, the TFT as shown in FIGS. 2 to 4 may be manufactured. In step S3, the TFT fabricated according to the initial width-to-length ratio is tested. In step S4, it is determined whether or not the test result satisfies a predetermined condition, and if the test result satisfies the predetermined condition, then in step S5, the initial width-to-length ratio is determined as the width-to-length ratio of the channel region of the TFT. In step S4, if the test result does not satisfy the predetermined condition, then in step S6, the value of the initial width-to-length ratio is changed, and a position of the mask plate is adjusted according to the changed initial width-to-length ratio, and steps S2 to S4 are performed again.

According to an embodiment of the present disclosure, the predetermined condition includes at least one of a condition in which an on-state current of the TFT when turned on is within a predetermined current range, a condition in which a threshold voltage of the TFT is within a predetermined voltage range, and a condition in which a carrier mobility of the channel region of the TFT is within a predetermined mobility range. For example, the predetermined condition may include a condition in which the on-state current of the TFT when turned on is within a predetermined current range of 20 µA to 100 µA, a condition in which the threshold voltage of the TFT is within a predetermined voltage range of greater than 0V, and a condition in which the carrier mobility of the channel region of the TFT is within a predetermined mobility range of 5 $cm^2/VS$ to 100 $cm^2/VS$.

It should be noted that the method for determining the width-to-length ratio of the channel region of the TFT provided by the present disclosure can be applied to a development and testing stage in the process of manufacturing TFTs to determine the width-to-length ratio of the channel regions of the TFTs that satisfy the predetermined condition, and thereafter mass production of the TFTs is performed in accordance with the width-to-length ratio.

According to an embodiment of the present disclosure, by performing the above described steps S1 to S6, the TFT satisfying the predetermined condition may be manufactured by repeatedly adjusting the width-to-length ratio of the channel region of the TFT to be manufactured.

Step S2 in FIG. 1 will be described in detail below with reference to FIGS. 2 to 4.

According to an embodiment of the present disclosure, the step of fabricating the TFT by using the mask plate according to the initial width-to-length ratio includes forming an active layer 104 and a gate electrode 106. The channel region of the TFT is defined by a region of the active layer 104 covered by an orthographic projection of the gate electrode 106 on the active layer 104 and has a width-to-length ratio equal to the initial width-to-length ratio.

For convenience of description, an example of manufacturing a top gate type TFT will be described in detail below, but the embodiment of the present disclosure is not limited thereto, and a bottom gate type TFT may also be manufactured.

Specifically, the step of manufacturing the TFT includes sequentially forming a light shielding layer 102, a buffer layer 103, the active layer 104, a gate insulating layer 105, the gate electrode 106 and an interlayer insulating layer 107 on a substrate 101. An orthographic projection of the light shielding layer 102 on the substrate 101 completely covers an orthographic projection of the active layer 104 on the substrate 101, so that the light shielding layer 102 may shield the active layer 104 to prevent backlight or other light from illuminating the active layer 104 to avoid adversely influencing the channel region of the TFT. The buffer layer 103 may insulate and separate the light shielding layer 102 from the active layer 104. The gate insulating layer 105 may insulate and separate the gate electrode 106 from the active layer 104 and cover only a portion of the active layer 104. A portion of the gate electrode 106 is disposed on the gate insulating layer 105 and another portion of the gate electrode 106 is disposed on the buffer layer 103.

According to an embodiment of the present disclosure, a region of the active layer 104 covered by an orthographic projection of the gate electrode 106 on the active layer 104 forms the channel region when the TFT is turned on.

After the above layers are sequentially formed, a source via hole, a drain via hole and a gate via hole penetrating through the interlayer insulating layer 107 are formed. The source via hole and the drain via hole are formed in the portion of active layer 104 which is not covered by the gate insulating layer 105, respectively, and the gate via hoe is formed in the portion of the gate electrode 106 disposed on the buffer layer 103 instead of the portion disposed on the gate insulating layer 105. A source electrode 109, a drain electrode 110 and a gate connection member 108 are formed in the source via hole, the drain via hole and the gate via hole, respectively, the source electrode 109 and the drain electrode 110 are coupled to the active layer 104, respectively, and the gate connection member 108 is coupled to the gate electrode 106.

By the arrangement in which a portion of the gate electrode 106 is disposed on the active layer 104, another portion of the gate electrode 106 is disposed on the buffer layer 103 and the gate connection member 108 is coupled to the portion of the gate electrode 106 disposed on the buffer layer 103, the influence of charges passing through the gate connection member 108 on the active layer 104 can be avoided when the TFT is turned on.

According to an embodiment of the present disclosure, as shown in FIGS. 2 to 4, the active layer 104 includes a channel portion 104a and two conductorized portions 104b, the two conductorized portions 104b are disposed on both ends of the channel portion 104a in a length direction of the channel portion 104a and configured to be coupled to the source electrode 109 and the drain electrode 104, respectively, and the channel portion 104a is configured to form the channel region when the TFT is turned on, that is, the region of the channel portion 104a covered by the orthographic projection of the gate electrode 106 on the active layer 104 is formed as the channel region.

The active layer 104 may be made of oxide or polysilicon, and the oxide may include at least one of IGZO, amorphous ZnO, polycrystalline ZnO, InZnO and ZnSnO.

According to an embodiment of the present disclosure, the step of forming the gate electrode includes: forming a gate material layer; forming a photoresist layer on the gate electrode material layer; exposing the photoresist layer by using a mask plate; developing the exposed photoresist layer to form a protective pattern having the same shape as that of the gate electrode to be formed; and etching the gate electrode material layer with by using the protective pattern as a mask to form the gate electrode.

The photoresist may be negative photoresist, and after exposure process and development process are performed on the negative photoresist, the negative photoresist corresponding to the exposure area of the mask plate forms the protective pattern, and the non-exposure area of the negative photoresist is removed by the developing process.

In order to fabricate the TFT having the initial width-to-length ratio, the gate electrode 106 may be formed such that the width-to-length ratio of the orthographic projection area of the gate electrode 106 on the active layer 104 is equal to the initial width-to-length ratio.

According to an embodiment of the present disclosure, in step S6 in FIG. 1, the step of adjusting a position of the mask plate according to the changed initial width-to-length ratio includes: changing a position of the orthographic projection area of the exposure area of the mask plate for forming the gate electrode 106 on the photoresist layer to change a position of an orthographic projection area of the to-be-formed gate electrode to be formed, such that the TFT to be formed has a width-to-length ratio equal to the initial width-to-length ratio.

Specifically, as shown in FIG. 2, the region of the active layer 104 covered by the orthographic projection of the gate electrode 106 forms the channel region of the TFT, and therefore, during the formation of the gate electrode 106, the orthographic projection area of the exposure area of the mask plate for forming the gate electrode 106 on the photoresist layer may be changed to change the orthographic projection area of the to-be-formed gate electrode 106 on the active layer 104, thereby changing the width-to-length ratio of the channel region. For example, comparing with the formation of the TFT shown in FIG. 2, the mask plate for forming the gate electrode 106 may be moved in the width direction of the active layer 104 during the formation of the gate electrode 106 to change the width of the orthographic projection region of the to-be-formed gate electrode 106 on the active layer 104, such that the width d of the channel region changes as the width of the orthographic projection region of the gate electrode 106 on the active layer 104 changes, thereby changing the width-to-length ratio of the channel region. The width direction of the active layer 104 is a direction perpendicular to an extending direction of the source electrode 109 and the drain electrode 110.

For example, as shown in FIGS. 2 to 4, the mask plate for forming the gate electrode 106 is moved in Y direction (i.e., the width direction), and the width d of the channel region of the TFT formed after moving the mask plate for forming the gate electrode 106 is changed, thereby changing the width-to-length ratio of the channel region.

According to an embodiment of the present disclosure, since the size of the orthographic projection of the gate electrode 106 on the active layer 104 in the width direction of the active layer 104 is smaller than the width d of the active layer 104, when manufacturing TFTs having different width-to-length ratios of channel region, the step of exposing and developing the photoresist layer by using the mask plate can be performed by using a same mask plate. Specifically, when the value of the initial width-to-length ratio is changed in step S6 and then it returns to step S2 to fabricate a new TFT according to the changed initial width-to-length ratio, the relative position between the orthographic projection area of the exposure area of the mask plate on the photoresist layer and the active layer 104 is different from the relative position between the orthographic projection area of the exposure area of the mask plate on the photoresist layer and the active layer 104 when the previous TFT whose test result does not satisfy the predetermined result is manufactured.

According to an embodiment of the present disclosure, the size of the orthographic projection area of the gate electrode 106 on the active layer 104 in the width direction of the active layer 104 is set to be smaller than the width of the channel portion 104a of the active layer 104, and thus, each time the value of initial width-to-length ratio is changed, it only needs to change the relative position between the orthographic projection area of the exposure area of the mask plate on the photoresist layer and the active layer. Therefore, the present disclosure can fabricate a variety of TFTs having different width-to-length ratios by using only one set of mask plates.

For example, if the TFT fabricated according to a specific initial width-to-length ratio does not satisfy the predetermined condition in step S4, for example, the on-state current of the TFT fabricated according to the specific initial width-to-length ratio when turned on is greater than the predetermined range, the mask plate can be moved in the Y direction such that the width d of the channel region can be decreased, which results in a decrease in the width-to-length ratio of the channel region to reduce the on-state current of the TFT when turned on.

In addition, the positional change of the mask plate in the Y direction does not introduce additional influence factors. Therefore, after the width-to-length ratio of the channel region is changed, the effect of adjusting the characteristics of the TFT is exclusive and significant, and there is no adverse effect in other aspect.

The TFTs fabricated according to an embodiment of the present disclosure may be used for a display device such as an OLED display panel. It should be noted that, as shown in FIGS. 2 and 4, the gate connection member 108 is disposed in the same layer as that of the source electrode 109 and the drain electrode 110, and gate driving lines (not shown in the drawings) of the display device coupled to the gate connection member 108 and data lines (not shown in the drawings) of the display device coupled to the source electrode 109 have a same wiring direction and do not intersect with each other, thereby ensuring normal operation of the TFT in the display device.

According to an embodiment of the present disclosure, in step S2, a bottom gate type TFT can also be fabricated according to the initial width-to-length ratio. In the process of manufacturing a top gate type TFT as described above, it is necessary to form an active layer first and then form a gate electrode on the active layer; in contrast, in the process of fabricating a bottom gate type TFT, it is necessary to form a gate electrode first and then form an active layer on the gate electrode such that the width-to-length ratio of the channel region of the TFT defined by the orthographic projection area of the gate electrode on the active layer is equal to the initial width-to-length ratio. For example, when the bottom gate type TFT is formed, a gate electrode, a gate insulating layer, an active layer, and a source and drain layer may be sequentially formed on a substrate.

According to an embodiment of the present disclosure, the forming of the active layer of the bottom gate type TFT includes: forming an active material layer; forming a photoresist layer on the active material layer; exposing and developing the photoresist layer by using a mask plate to form a protective pattern having the same shape as that of the active layer; and etching the active material layer by using the protective pattern as a mask to form the active layer.

In the case of fabricating a bottom gate type TFT, in step S6 in FIG. 1, the step of adjusting a position of the mask plate according to the changed initial width-to-length ratio includes: changing a position of the orthographic projection area of the exposure area of the mask plate for forming the active layer on the photoresist layer to change a position of the orthographic projection area of the to-be formed gate electrode on the active layer, such that the TFT to be formed has a width-to-length ratio equal to the initial width-to-length ratio.

For example, the mask plate for forming the active layer may be moved in the width direction of the active layer such that the position of the orthographic projection area of the exposure area of the mask plate for forming the active layer on the photoresist layer is changed, thereby changing the width of the formed active layer and accordingly changing the width-to-length ratio of the channel region.

When the value of the initial width-to-length ratio is changed in step S6 and then the method returns to step S2 to manufacture the TFT according to the changed initial width-to-length ratio, the relative position between the orthographic projection area of the exposure area of the mask plate on the photoresist layer and the gate electrode is different from the relative position between the orthographic projection area of the exposure area of the mask plate on the photoresist layer and the gate electrode when the previous TFT whose test result does not satisfy the predetermined result is manufactured.

Figure 5:
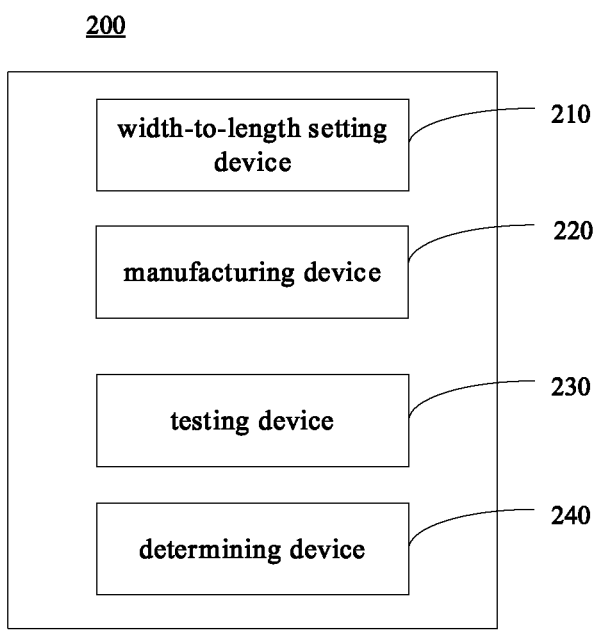
FIG. 5 is a block diagram of an apparatus for determining a width-to-length ratio of a channel region of a TFT according to an embodiment of the present disclosure.

FIG. 5 is a block diagram of an apparatus for determining a width-to-length ratio of a channel region of a TFT according to an embodiment of the present disclosure.

According to an embodiment of the present disclosure, the apparatus 200 for determining the width-to-length ratio of the channel region of the TFT includes a width-to-length ratio setting device 210, a manufacturing device 220, a testing device 230 and a determining device 240.

The width-to-length ratio setting device 210 is configured to set the initial width-to-length ratio of the channel region of the TFT to be fabricated. The manufacturing device 220 is configured to manufacture the TFT by using a mask plate according to the initial width-to-length ratio set by the width-to-length ratio setting device 210. Since the method of manufacturing TFT has been described in detail above with reference to FIGS. 2 to 4, the description thereof will not be repeated herein.

The testing device 230 is configured to test the TFT fabricated according to the initial width-to-length ratio. The determining device 240 is configured to determine whether or not the test result of the testing device 230 satisfies a predetermined condition. If the determination result of the determining device 240 is that the test result satisfies the predetermined condition, the width-to-length ratio setting device 210 is further configured to determine the initial width-to-length ratio as the width-to-length ratio of the channel region of the TFT. If the determination result of the determining device 240 is that the test result does not satisfy the predetermined condition, the width-to-length ratio setting device 210 changes the value of the initial width-to-length ratio and adjusts the position of the mask plate according to the changed initial width-to-length ratio. In this case, the manufacturing device 220 remanufactures a new TFT according to the changed initial width-to-length ratio, the testing device 230 tests the remanufactured TFT, and the determining device 240 determines whether or not the test result satisfies the predetermined condition. Since the method of changing the initial width-to-length ratio has been described in detail above, the description thereof will not be repeated herein.

The respective devices in the apparatus 200 repeat the above processes until the manufactured TFT satisfies the predetermined condition.

According to an embodiment of the present disclosure, each of the width-to-length ratio setting device 210, the testing device 230 and the determining device 240 may include a memory and a processor, each memory stores instructions, and when the instructions stored in the memory of the width-to-length ratio setting device 210, the testing device 230 or the determining device 240 are executed, the processor corresponding to the memory causes the corresponding device to perform corresponding functions.

According to an embodiment of the present disclosure, the apparatus 200 for determining the width-to-length ratio of the channel region of the TFT may be an integrated apparatus composed of the width-to-length ratio setting device 210, the manufacturing device 220, the testing device 230 and the determining device 240, or may be a combined apparatus including the width-to-length ratio setting device 210, the testing device 230, and the determining device 240 separately.

The apparatus 200 for determining the width-to-length ratio of the channel region of the TFT according to the embodiment of the present disclosure can manufacture a thin film transistor satisfying the predetermined condition by adjusting the width-to-length ratio of the channel region of the TFT multiple times.

It is to be understood that the above embodiments are merely exemplary embodiments employed to explain the principles of the present disclosure, but the present disclosure is not limited thereto. Various modifications and improvements can be made by those ordinary skilled in the art without departing from the spirit and scope of the disclosure, and such modifications and improvements are also considered to be within the scope of the disclosure.

The invention claimed is:

1. A method for manufacturing a thin film transistor (TFT), the method comprising:
    setting, by a processor, an initial width-to-length ratio;
    providing a mask plate for forming a gate electrode of the TFT according to the initial width-to-length ratio;
    adjusting a position of the mask plate according to a width-to-length ratio of a channel region of the TFT, and manufacturing the TFT having the width-to-length ratio by using the mask plate,
    wherein in a case where the width-to-length ratio of the TFT is a first width-to-length ratio, the position of the mask plate is adjusted to a first position at which an orthographic projection area of an exposure area of the mask plate on an active layer of the TFT has a width-to-length ratio corresponding to the first width-to-length ratio,
    in a case where the width-to-length ratio of the TFT is a second width-to-length ratio different from the first width-to-length ratio, the position of the mask plate is adjusted to a second position at which the orthographic projection area of the exposure area of the mask plate on the active layer of the TFT has a width-to-length ratio corresponding to the second width-to-length ratio, the second position being different from the first position, and
    a portion of the active layer is not covered by the gate electrode, and an orthographic projection of the gate electrode on the active layer covers only a sidewall of the channel region at one side of the channel region.

2. The method according to claim 1, wherein the manufacturing of the TFT having the width-to-length ratio by using the mask plate comprises:
    forming the active layer and the gate electrode, wherein the channel region is defined by a region of the active layer covered by an orthographic projection of the gate electrode on the active layer and has a width-to-length ratio equal to the initial width-to-length ratio.

3. The method according to claim 2, wherein the forming the active layer and the gate electrode comprises:
    forming the active layer; and
    forming the gate electrode on the active layer;
    wherein the step of forming the gate electrode comprises:
    forming a gate electrode material layer on the active layer;
    forming a photoresist layer on the gate electrode material layer;
    exposing the photoresist layer by using an exposure area of the mask plate;
    developing the exposed photoresist layer to form a protective pattern having the same shape as that of the gate electrode; and
    etching the gate material layer by using the protective pattern as a mask to form the gate electrode.

4. The method according to claim 2, wherein the active layer is made of a material comprising at least one of IGZO, amorphous ZnO, polycrystalline ZnO, InZnO and ZnSnO.

5. The method according to claim 3, wherein the adjusting the position of the mask plate comprises:
    adjusting a position of an orthographic projection area of the exposure area of the first mask plate on the photoresist layer.

6. The method according to claim 3, wherein the manufacturing of the TFT having the width-to-length ratio by using the mask plate comprises:
    forming a light shielding layer, a buffer layer, the active layer, a gate insulating layer, the gate electrode and an interlayer insulating layer on a substrate sequentially,
    wherein an orthographic projection of the light shielding layer on the substrate completely covers an orthographic projection of the active layer on the substrate,
    wherein the buffer layer insulates and separates the light shielding layer from the active layer,
    wherein the gate insulating layer insulates and separates the gate electrode from the active layer and covers only a portion of the active layer, and
    wherein a portion of the gate electrode is on the gate insulating layer, and another portion of the gate electrode is on the buffer layer.

7. The method according to claim 5, wherein the step of adjusting the position of the orthographic projection area of the exposure area of the mask plate on the photoresist layer comprises:
    changing the position of the orthographic projection area of the exposure area of the mask plate on the photoresist layer in a width direction of the active layer, wherein the width direction of the active layer is a direction perpendicular to an extending direction of a source electrode and a drain electrode of the TFT to be formed.

8. The method according to claim 6, wherein the manufacturing of the TFT having the width-to-length ratio by using the mask plate further comprises:

forming a source via hole, a drain via hole and a gate via hole that penetrate through the interlayer insulating layer, the source via hole and the drain via hole being respectively formed on a portion of the active layer which is not covered by the gate insulating layer, the gate via hole being formed on the portion of the gate electrode on the buffer layer; and forming a source electrode, a drain electrode and a gate connection member in the source via hole, the drain via hole and the gate via hole, respectively, the source electrode and the drain electrode being coupled to the active layer, respectively, and the gate connection member being coupled to the gate electrode.

\* \* \* \* \*